(12) United States Patent
Ishii et al.

US006885538B1

(10) Patent No.: US 6,885,538 B1
(45) Date of Patent: Apr. 26, 2005

(54) CAPACITOR MOUNTING STRUCTURE

(75) Inventors: Ryuuichi Ishii, Tokyo (JP); Satoshi Ishibashi, Tokyo (JP); Akira Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/938,824

(22) Filed: Sep. 13, 2004

(30) Foreign Application Priority Data

Mar. 22, 2004 (JP) ..................................... P2004-083127

(51) Int. Cl.$^7$ .............................. H01G 4/00; H01G 2/20
(52) U.S. Cl. ............................... 361/301.3; 361/308.1; 361/766
(58) Field of Search .......................... 361/306.1, 306.2, 361/306.3, 308.1, 308.2, 308.3, 307, 309–310, 301.3, 517–521, 535–540, 765–766, 782

(56) References Cited

U.S. PATENT DOCUMENTS 6,236,557 B1 * 5/2001 Kashihara et al. ........ 361/301.3
6,400,551 B1 * 6/2002 Lin et al. ................. 361/301.3
6,442,014 B1 * 8/2002 Lin ......................... 361/301.3
6,477,030 B2 * 11/2002 Hidaka et al. ........... 361/301.3
6,515,844 B1 * 2/2003 Moriwaki et al. ....... 361/306.1
6,735,071 B2 * 5/2004 Oohashi et al. .......... 361/306.1
2001/0028544 A1 * 10/2001 Sano et al. .............. 361/301.3

FOREIGN PATENT DOCUMENTS

JP          04-180211 A      6/1992

* cited by examiner

Primary Examiner—Eric Thomas
(74) Attorney, Agent, or Firm—Sughrue Mion, PLLC

(57) ABSTRACT

A capacitor mounting structure is proposed which can easily relieve a stress given to an extraction lead when ambient temperature is changed, soldering is made, or vibration is given, and can prevent breakage of the extraction lead. An outside holder is provided at an outside of a resin case housing a capacitor covered with a filler, and an inside holder is provided. The outside holder includes an upper outer wall bonded to an upper resin wall of the resin case. Lower openings of the resin case and the outside holder overlap with each other and form a lower space. An extraction lead is disposed in the lower space.

10 Claims, 2 Drawing Sheets

CAPACITOR MOUNTING STRUCTURE

BACKGROUND OF THE INVENTION

1. Field of the Invention

The present invention relates to a capacitor mounting structure, and particularly to a capacitor mounting structure in which a resin case for housing a capacitor is mounted on a board surface of a printed board.

2. Description of the Related Art

JP-A-4-180211 discloses that a capacitor is housed in a resin case having a lower opening, a filler is filled between the capacitor and the resin case, the lower opening of the resin case is made to face a printed board, and the resin case is mounted on a board surface of the printed board.

This prior art describes that a stress is generated in a soldered portion of a lead from the capacitor because there is a difference in thermal expansion coefficient between the capacitor and the printed board or because the printed board is curved by heat at the time of solder dipping and has a displacement in the radial direction of a curve, and accordingly, a step of further applying heat to the solder to perform re-soldering is required after the solder dipping step in order to relieve the stress to return the printed board to the original state, in a case where a temperature change is large and the stress to the soldered portion is large, or in a case where the temperature change frequently occurs and the stress is repeatedly applied to the soldered portion, the solder can not resist the stress, and a crack occurs in the soldered portion, the crack in the soldered portion occurs in the soldered portion on the lower board surface of the printed board, the stress in the direction parallel to the board surface of the printed board has a greatest influence on the occurrence of the crack in the soldered portion, and the crack causes poor conduction of the capacitor.

This prior art discloses that a gap part of 3 mm or more is formed between the filler exposed from the lower opening of the resin case and the printed board, so as to mount the capacitor, and describes that the gap part of 3 mm or more can relieve the stress generated by the temperature change of the periphery of the attachment place of the capacitor so that the burden of the stress to the soldered portion of the extraction lead of the capacitor can be reduced.

In the prior art (JP-A-4-180211), FIGS. 2, 4 and 5, and the description in page 1, right column, line 11 to page 2, left column, line 10 are especially noted.

However, since the capacitor mounting structure disclosed in the prior art has such a structure that the self weights of the capacitor, the filler and the resin case are supported by the extraction lead and the bottom surface of the resin case being in contact with the upper board surface of the printed board, especially in a case of the capacitor used for a control unit mounted in a vehicle, a large vibration is repeatedly applied, and there is a fear that the extraction lead is broken by the vibration, and especially it has been difficult to mount a large capacitor. Besides, at the time of soldering, since fixation of the capacitor is not surely performed, a position shift or fall of the capacitor occurs by the vibration, and therefore, it has been necessary to ensure a sufficient gap around the capacitor on the upper board surface.

SUMMARY OF THE INVENTION

The present invention provides a capacitor mounting structure which improves the problems as stated above and is excellent in reliability to an extraction lead and shock-proof property.

A capacitor mounting structure according to the invention includes a capacitor, a resin case and a filler, and further includes an outside holder. The capacitor has an extraction lead and is mounted on an upper board surface of a printed board. The resin case is for housing the capacitor therein and has an upper resin wall covering an upper part of the capacitor, a side resin wall surrounding a peripheral side part of the capacitor, and a lower opening. The filler is filled between the capacitor and the resin case and is exposed from the lower opening of the resin case. The outside holder holds the resin case at its outside and has a lower opening. The lower opening of the resin case and the lower opening of the outside holder overlap with each other to form a lower space adjacent to the upper board surface and the filler. The extraction lead is fixed to the printed board through the lower space.

In the capacitor mounting structure of the invention, since the outside holder for holding the resin case at the outside part is disposed, the self weights of the capacitor, the filler and the resin case can be held by the outside holder at the outside of the resin case, and breakage of the extraction lead due to vibration can be prevented. In addition, the extraction lead of the capacitor is fixed to the printed board through the lower space formed by overlap between the lower openings of the resin case and the outside holder, so that a stress exerted on the extraction lead can be sufficiently relieved, and the reliability of connection between the extraction lead and the printed board can also be ensured.

DETAILED DESCRIPTION OF THE INVENTION

Some embodiments of this invention will be described with reference to the drawings.

Embodiment 1

Figure 1:
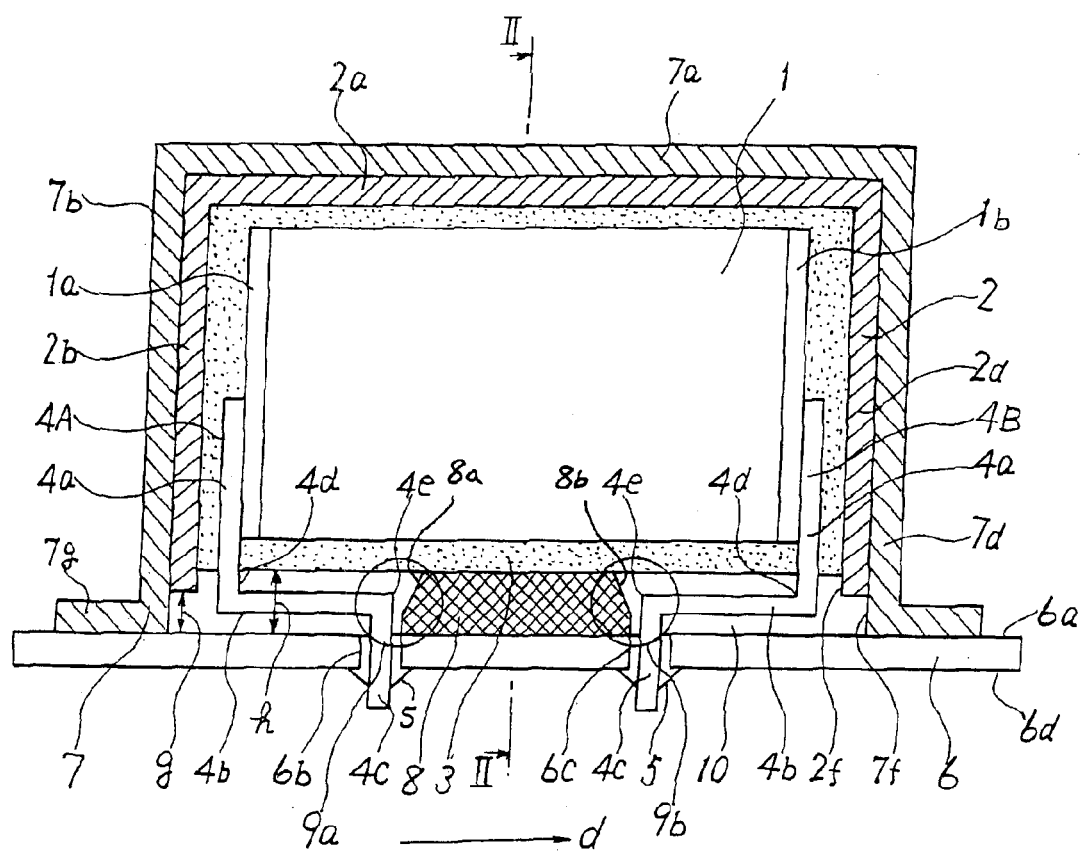
FIG. 1 is a side sectional view showing embodiment 1 of a capacitor mounting structure of this invention.
Figure 2:
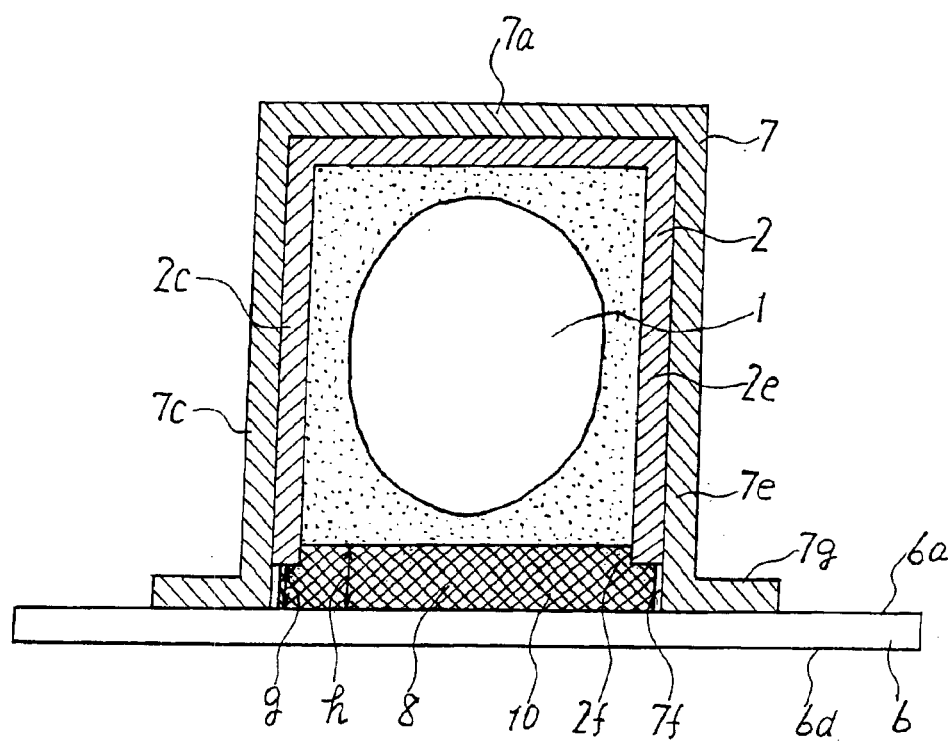
FIG. 2 is a sectional view taken along line II—II of FIG. 1.

FIG. 1 is a side sectional view showing embodiment 1 of a capacitor mounting structure of this invention, and FIG. 2 is a sectional view taken along line II—II of FIG. 1.

The capacitor mounting structure of the embodiment 1 includes a capacitor 1, a filler 3, a resin case 2, extraction leads 4A and 4B, an outside holder 7, and an inside holder 8, and is for mounting the capacitor 1 on an upper board surface 6a of a printed board 6.

The capacitor 1 is, for example, a capacitor called a film capacitor, is constructed by winding a dielectric film, and has a rectangular parallelepiped shape. This capacitor 1 includes electrodes 1a and 1b at both side ends, and the extraction leads 4A and 4B are fixed to the electrodes 1a and 1b. The filler 3 is made of, for example, hard epoxy resin, covers the whole of the capacitor 1, that is, an upper surface, a lower surface and a peripheral surface thereof, to protect the capacitor 1.

The resin case 2 is made of, for example, hard polyphenylene sulfide resin (PPS resin) and is formed to have a rectangular parallelepiped box shape, and houses the capacitor 1. The filler 3 is filled between the capacitor 1 and the resin case 2. The filler 3 is injected into a gap between the capacitor 1 and the resin case 2 so as to cover the capacitor 1 and is hardened.

The resin case 2 is constructed by integrally forming an upper resin wall 2a and four side resin walls 2b, 2c, 2d and 2e, has an opened lower part, and has a lower opening 2f at the lower part. The part of the filler 3 covering the lower surface of the capacitor 1 is exposed from the lower opening 2f.

The upper resin wall 2a of the resin case 2 has a rectangular shape, and is disposed on a plane almost parallel to the upper board surface 6a of the printed board 6. The upper resin wall 2a covers the upper surface of the capacitor 1 which is covered with the filler 3, is opposite to the upper part of the filler 3 covering the upper surface of the capacitor 1, and is in contact therewith. The four side resin walls 2b, 2c, 2d and 2e of the resin case 2 are formed integrally with the upper resin wall 2a, are bent almost at right angles from four ends of the upper resin wall 2a, and extend toward the upper board surface 6a. The four side resin walls 2b, 2c, 2d and 2e cover four peripheral surfaces of the capacitor 1 covered with the filler 3, are opposite to the peripheral parts of the filler 3 covering the four peripheral surfaces of the capacitor 1, and are in contact therewith. Lower end faces of the side resin walls 2b, 2c, 2d and 2e of the resin case 2 are respectively opposite to the upper board surface 6a through a gap g. In the embodiment 1, the gap g is, for example, 3 mm.

The outside holder 7 is formed of a metal plate, for example, a stainless-steel plate to have a rectangular parallelepiped box shape. The outside holder 7 is disposed to cover the outside of the resin case 2. The outside holder 7 is constructed by integrally forming an upper outer wall 7a, four side outer walls 7b, 7c, 7d and 7e, and a mounts 7g, has an opened lower part, and has a lower opening 7f at the lower part. The upper outer wall 7a of the outside holder 7 has a rectangular shape slightly larger than the upper resin wall 2a, and is disposed on a plane almost parallel to the upper board surface 6 and the upper resin wall 2a. The upper outer wall 7a is opposite to the outer surface of the upper resin wall 2a and is bonded thereto by adhesive.

The four side outer walls 7b, 7c, 7d and 7e of the outside holder 7 are formed integrally with the upper outer wall 7a, are bent almost at right angles from four ends of the upper outer wall 7a, and extends toward the upper board surface 6a. The four side outer walls 7b, 7c, 7d and 7e are respectively opposite to the outer surfaces of the side resin walls 2b, 2c, 2d and 2e so as to surround them and be in contact therewith. In this embodiment 1, although the outer surfaces of the side outer walls 7b, 7c, 7d and 7e and the side resin walls 2b, 2c, 2d and 2e are not bonded to each other by adhesive, when these are bonded by adhesive, the resin case 2 is held by the outside holder 7 more firmly, and therefore, the shockproof property is more improved.

The lower opening 2f of the resin case 2 and the lower opening 7f of the outside holder 7 overlap with each other, and form a lower space 10. The lower space 10 is adjacent to the upper board surface 6a and is adjacent to the lower part of the filler 3 covering the lower part of the capacitor 1. A gap length h of the lower space 10, that is, the gap length h between the upper board surface 6a and the filler 3 is 3 mm or more, for example, 5 mm.

Each of the mounts 7g is formed integrally with the side outer wall 7b, 7c, 7d and 7e, is bent almost at right angles from lower end of the side outer wall 7b, 7c, 7d and 7e, and extends almost in parallel to the upper board surface 6a. Each of the mounts 7g is attached to the upper board surface 6a of the printed board 6 so that the lower openings 2f and 7f overlap with each other to form the lower space 10. In this embodiment 1, each of the mounts 7g is fixed to the upper board surface 6a by screw. However, each of the mounts 7g can also be fixed to the upper board surface 6a by adhesive.

Each of the extraction leads 4A and 4B includes a first portion 4a, a second portion 4b and a third portion 4c. The first portion 4a extends from the electrode 1a, 1b of the capacitor 1 toward the upper board surface 6a almost vertically. The second portion 4b is bent from the first portion 4a at almost right angles, and extends along the upper board surface 6a in parallel thereto. The third portion 4c is bent from the second portion 4b almost vertically, extends toward the upper board surface 6a almost vertically, and passes through a through hole 6b, 6c of the printed board 6. A soldered portion 5 is formed on a lower board surface 6d of this through portion, and the third portion is mechanically attached to the printed board 6 by this soldered portion 5 and is electrically connected to a wiring pattern on the upper board surface 6a or the lower board surface 6d.

A first bent part 4d is formed between the first portion 4a and the second portion 4b of each of the extraction leads 4A and 4B, and a second bent part 4e is formed between the second portion 4b and the third portion 4C thereof. The first and the second bent parts 4d and 4e are positioned in the lower space 10, and give large deformation, that is, elongation and deflection to the extraction leads 4A and 4B.

The inside holder 8 is further disposed in the lower space 10. The inside holder 8 is fixed to the upper board surface 6a between the through holes 6b and 6c. This inside holder 8 is formed of, for example, hard polyphenylene sulfide resin (PPS resin) similarly to the resin case 2, and is fixed to the upper board surface 6a by press inserting an attachment pin in the upper board surface 6a or by adhesive. The upper surface of the inside holder 8 is opposite to the filler 3 exposed in the lower space 10 and the lower end faces of the side resin walls 2c and 2e of the resin case 2, are bonded to the filler 3 and the lower end faces of the side resin walls 2c and 2e by adhesive, and holds the filler 3 and the resin case 2.

Incidentally, this inside holder 8 may be disposed opposite only to the filler 3 without being opposite to the lower end faces of the side resin walls 2c and 2e, and bonded to the filler 3, so as to hold only the filler 3. Alternatively, the inside holder 8 may be disposed opposite merely to the lower end faces of the side resin walls 2c and 2e, without being opposite to the filler 3, and bonded to the side resin walls 2c and 2e to hold only the resin case 2.

The resin case 2 housing therein the capacitor 1 as well as the filler 3 is attached to the upper board surface 6a in the state where the resin case is housed in the inside of the outside holder 7. The inside holder 8 is previously fixed to the upper board surface 6a between the through holes 6b and 6c, and the outside holder 7 is attached to the upper board surface 6a by the mounts 7g, so that the inside holder 8 is positioned in the lower space 10 and further the inside holder 8 is bonded to the filler 3 covering the lower surface of the capacitor 1. The inside holder 8 has guide surfaces 8a and 8b at side surfaces adjacent to the through holes 6b and 6c. In the state where the resin case 2 housing the capacitor 1 covered with the filler 3 is housed in the outside holder 7, when the outside holder 7 is attached to the upper board surface 6a, the guide surfaces 8a and 8b come in contact with the third portions 4c of the extraction leads 4A and 4B to guide the third portions 4c to the through holes 6b and 6c.

Incidentally, circular portions 9a and 9b of FIG. 1 show the guide surfaces 8a and 8b and the third portions 4c of the extraction leads 4A and 4B adjacent thereto.

In this embodiment 1, the upper outer wall 7a of the outside holder 7 is bonded to the upper resin wall 2a of the resin case 2, and holds the capacitor 1 which is, together with the filler 3, housed in its inside. Besides, the inside holder 8 is bonded to the filler 3 and holds it. Thus, the lower ends of the side resin walls 2b, 2c, 2d and 2e are held in a state where they are opposite to the upper board surface 6a through the gap g. In other words, since the resin case 2 can be suspended above the upper board surface 6a by the gap g, the gap length h of the lower space 10 can be made sufficiently large. In the embodiment 1, although the gap length h is set to, for example, 5 mm, when the gap length h is 3 mm or more, deformation such as elongation or deflection can be sufficiently given to the extraction leads 4A and 4B in the lower space 10.

The deformation of the extraction leads 4A and 4B in the lower space 10 can be further increased by the bent structure including the first and the second bent parts 4d and 4e. According to the deformation of the extraction leads 4A and 4B in this lower space 10, in an actual use state of the capacitor 1, a stress acting in a direction of an arrow d in parallel to the upper board surface 6a, which is generated by a change in temperature of the periphery of an attachment place of the capacitor 1 since there is a difference in thermal expansion coefficient between the capacitor 1 and the printed board 6, or caused by deformation due to warp of the printed board 6 produced at the time of dip soldering, can be sufficiently relieved by deformation such as elongation or deflection of the extraction leads 4A and 4B.

Further, for example, in the case where the capacitor mounting structure is used for a control unit mounted in a vehicle, when vibration is applied to the capacitor mounting structure, at the upper surface of the capacitor 1, the upper outer wall 7a of the outside holder 7 holds the upper resin wall 2a of the resin case 2, and the inside holder 8 holds at least one of the filler 3 covering the lower part of the capacitor 1 and the lower end faces of the side resin walls 2c and 2e, so that it is possible to restrain the resin case 2 and the capacitor 1 which is housed in the resin case 2 together with the filler 3 from vibrating, the stress generated in the extraction leads 4A and 4B by the vibration can be reduced, and the breakage of the extraction leads 4A and 4B can be prevented.

In the case of a control unit mounted in a vehicle, as reliability against vibration, it is often requested to resist a vibration endurance test for 36 hours under a frequency of 20 to 200 Hz, an acceleration of 5 G and in the respective directions of X, Y and Z of a three dimensional space of XYZ. In order to resist the vibration endurance test on this level, it is necessary that the resonant frequency of the capacitor mounting structure does not exist in the endurance frequency, and the stress given to the extraction leads 4A and 4B is suppressed below the fatigue limit thereof. In the case where the outside holder 7 and the inside holder 8 do not exist, the resonant frequency of the capacitor assembly is a mere several tens Hz, and this resonant frequency is contained in the endurance frequency.

In the capacitor mounting structure of the embodiment 1, at the upper part of the capacitor 1, the upper outer wall 7a of the outside holder 7 holds the upper resin wall 2a of the resin case 2, and the inside holder 8 holds at least one of the filler 3 covering the lower part of the capacitor 1 and the side resin walls 2c and 2e, so that the resonant frequency of the capacitor mounting structure can be raised to 300 Hz or higher, and the stress generated in the extraction leads 4A and 4B can be made below the fatigue limit, and therefore, the breakage of the extraction leads 4A and 4B can be prevented.

Besides, at the time of soldering, since the upper part of the capacitor 1 and the lower part thereof are respectively fixed to the printed board 6 by the outside holder 7 and the inside holder, the position shift or fall of the capacitor 1 can be prevented.

In the case where a pitch size tolerance between the extraction leads 4A and 4B of the capacitor 1 is large, or in the case where the space around the outside holder 7 is small, the insertion of the extraction leads 4A and 4B into the through holes 6b and 6c is difficult, however, by providing the guide surfaces 8a and 8b on the inside holder 8, the third portions 4c of the extraction leads 4A and 4B can be easily inserted into the through holes 6b and 6c.

Incidentally, in the case where the linear expansion coefficient of the outside holder 7 is largely different from the linear expansion coefficient of the resin case 2, or in the case where the linear expansion coefficient of the inside holder 8 is largely difference from the linear expansion coefficient of the extraction leads 4A and 4B, a large stress is generated in the soldered portion 5 by the difference in the thermal expansion coefficient or thermal shrinkage coefficient, and therefore, it is also necessary to match the linear expansion coefficients between the outside holder 7 and the resin case 2, and between the inside holder 8 and the extraction leads 4A and 4B.

In the embodiment 1, although the outside holder 7 and the inside holder 8 are directly attached to the printed board 6, when the printed board 6 has a fixture such as a chassis, the attachment to such a texture also achieves the same effect.

Embodiment 2

In the embodiment 1, the upper outer wall 7a of the outside holder 7 is bonded to the upper resin wall 2a of the resin case 2 by adhesive, so that the resin case 2 is held at its outside by the outside holder 7, and further, the inside holder 8 is bonded to at least one of the filler 3 and the side resin walls 2c and 2e by adhesive, so that at least one of the filler 3 and the resin case 2 is also held by the inside holder 8. However, in this embodiment 2, the inside holder 8 is omitted, or although the inside holder 8 is disposed, it is not bonded to the filler 3 and the lower end face of the resin case 2.

In this embodiment 2, although holding by the inside holder 8 to the filler 3 becomes lost, instead thereof, in an outside holder 7, in addition to an upper outer wall 7a, side outer walls 7b, 7c, 7d and 7e are also bonded to outside surfaces of side resin walls 2b, 2c, 2d and 2e of the resin case 2 by adhesive. The other structure is the same as the embodiment 1.

According to this structure, since the outside holder 7 holds the resin case 2 not only at the upper outer wall 2a but also at the side outer walls 7b, 7c, 7d and 7e, similarly to the embodiment 1, shockproof property can be improved, while breakage of the extraction leads 4A and 4B is prevented.

Other Embodiments

In the embodiments 1 and 2, an outside holder 7 can also be used in which in the pairs of the opposite side outer walls 7b and 7d and the side outer walls 7c and 7e, either one pair of the opposite side outer walls 7b and 7d or 7c and 7e are omitted. Besides, the resin case 2 is attached to the upper board surface 6a, and then, the outside holder 7 can be bonded to the upper resin wall 2a of the resin case 2 and the upper board surface 6a by adhesive or the like. Further, in the case where plural resin cases each housing therein a capacitor 1 are disposed on an upper board surface 6a of an attachment base member 6, when an outside holder 7 is made to cover and hold the plural resin cases in common, miniaturization of an assemble and simplification of an assembling operation can be realized. In this case, in the outside holder 7, either one pair of the opposite side outer walls 7b and 7d or 7c and 7e in the pairs of the opposite side outer walls 7b and 7d, and 7c and 7e are removed, and the resin case 2 can also be made to be held by the remaining pair of the opposite side outer walls 7c and 7e or 7b and 7e.

The capacitor mounting structure of this invention can be used for usage requiring shockproof strength against, for example, vibration of a vehicle or the like.

What is claimed is:

1. A capacitor mounting structure including:
    a capacitor having an extraction lead, the capacitor being mounted on an upper board surface of a printed board;
    a resin case for housing the capacitor therein having an upper resin wall covering an upper part of the capacitor, a side resin wall surrounding a peripheral side part of the capacitor, and a lower opening; and
    a filler filled between the capacitor and the resin case and exposed from the lower opening of the resin case, wherein
    the capacitor mounting structure further includes an outside holder for holding the resin case at its outside,
    the outside holder has a lower opening,
    the lower opening of the resin case and the lower opening of the outside holder overlap with each other to form a lower space adjacent to the upper board surface and the filler, and
    the extraction lead is fixed to the printed board through the lower space.

2. The capacitor mounting structure according to claim 1, wherein the lower space has a gap length of 3 mm or more between the filler and the upper board surface.

3. The capacitor mounting structure according to claim 1, wherein the extraction lead is soldered to a through hole of the printed board via a bent portion positioned in the lower space.

4. The capacitor mounting structure according to claim 3, wherein the extraction lead includes a first portion extending from the capacitor toward the upper board surface, a second portion extending from the first portion along the upper board surface, and a third portion extending from the second portion toward the upper board surface, and the bent portion includes a first bent part between the first portion and the second portion, and a second bent part between the second portion and the third portion.

5. The capacitor mounting structure according to claim 1, wherein the outside holder includes an upper outer wall opposite to the upper resin wall and a side outer wall opposite to the side resin wall, and the upper outer wall is bonded to the upper resin wall to holds the resin case.

6. The capacitor mounting structure according to claim 5, wherein the side outer wall is bonded to the side resin wall.

7. The capacitor mounting structure according to claim 5, wherein a mount is provided on the side outer wall, and the outside holder is fixed to the printed board by the mount.

8. The capacitor mounting structure according to claim 1, wherein an inside holder attached to the upper board surface is disposed in the lower space, and the inside holder holds at least one of the filler and a lower end face of the resin case.

9. The capacitor mounting structure according to claim 8, wherein the inside holder is bonded to at least one of the filler and lower end face of the resin case and holds it.

10. The capacitor mounting structure according to claim 8, wherein the inside holder has a guide surface for guiding the extraction lead to a through hole of the printed board.

* * * * *